(12) United States Patent
Akolkar et al.

(10) Patent No.: US 7,338,585 B2
(45) Date of Patent: Mar. 4, 2008

(54) ELECTROPLATING CHEMISTRIES AND METHODS OF FORMING INTERCONNECTIONS

(75) Inventors: Rohan N. Akolkar, Hillsboro, OR (US); Valery M. Dubin, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 11/383,925

(22) Filed: May 17, 2006

(65) Prior Publication Data
US 2007/0267297 A1 Nov. 22, 2007

(51) Int. Cl.
*C25D 5/02* (2006.01)
*C25D 7/12* (2006.01)
*C25D 3/38* (2006.01)

(52) U.S. Cl. ............... 205/118; 205/123; 205/157; 205/296

(58) Field of Classification Search ............... 205/118, 205/123, 157, 296
See application file for complete search history.

(56) References Cited

U.S. PATENT DOCUMENTS

| 3,328,273 A * | 6/1967 | Crentz et al. ............ 205/298 |
| 6,491,803 B1 | 12/2002 | Shen et al. |
| 2005/0077181 A1 | 4/2005 | Zierath et al. |
| 2005/0209117 A1 * | 9/2005 | Friedrich et al. ........... 510/175 |

FOREIGN PATENT DOCUMENTS

WO WO-02/058135 A2 7/2002

* cited by examiner

*Primary Examiner*—Edna Wong
(74) *Attorney, Agent, or Firm*—Blakely, Sokoloff, Taylor & Zafman LLP

(57) ABSTRACT

A method comprising forming an interconnection opening through a dielectric material to a contact point; and electroplating a interconnection comprising copper in the contact opening using an electroplating bath comprising an alkoxylated sulfopropylated alkylamine. A method comprising forming an interconnection opening through a dielectric material to a contact point; lining the interconnection opening with a barrier layer and a seed layer; and electroplating an interconnection comprising copper in the contact opening using an electroplating bath comprising an alkoxylated sulfopropylated alkylamine.

21 Claims, 1 Drawing Sheet

ELECTROPLATING CHEMISTRIES AND METHODS OF FORMING INTERCONNECTIONS

BACKGROUND

FIELD

Integrated circuit processing.

BACKGROUND

Modern integrated circuits use conductive interconnections to connect the individual devices on a chip or to send and/or receive signals external to the chip. One popular type of interconnection are copper interconnections (lines) that coupled to individual devices, including other interconnections (lines) by interconnections through vias.

A typical method of forming an interconnection, particularly a copper interconnection, is a damascene process. A typical damascene process involves forming a via and an overlying trench in a dielectric to an underlying circuit device, such as a transistor or an interconnection. The via and trench are then lined with a barrier layer of a refractory material, such as titanium nitride (TiN), tantalum (Ta), tantalum nitride (TaN) or their combinations. The barrier layer serves, in one aspect, to inhibit the diffusion of the interconnection material that will subsequently be introduced in the via and trench into the dielectric. Next, a suitable seed material is deposited on the wall or walls of the via and trench. Suitable seed materials for the deposition of copper interconnection material include copper (Cu), nickel (Ni), and cobalt (Co). Interconnection material, such as copper, is then deposited by electroplating or physical deposition in a sufficient amount to fill the via and trench and complete the interconnection structure. Once introduced, the interconnection structure may be planarized and a dielectric material (including an interlayer dielectric material) introduced over the interconnection structure to suitably isolate the structure.

Advancements in integrated circuit processing have dictated that a line width of an interconnection structure and therefore its correspondence via and trench openings be reduced. As line widths are reduced to 60 nanometers or less, aspect ratios, measured as a thickness of the dielectric relative to a line width of the opening of the via/trench, can be on the order of four to one or five to one (e.g., assuming a dielectric thickness on the order of 200 nanometers). When the interconnect openings are lined with a barrier layer and a seed material, the opening left for plating copper is very narrow making it increasingly difficult to electroplate copper into the openings (e.g., electroplating copper into openings having aspect ratios that may approach 20 to one or greater). If the thickness of the barrier layer and/or seed material is reduced, the electroplating of copper may be compromised. If the thickness of the barrier layer and/or seed material are too thick, the combined thickness can "pinch-off" the interconnection opening leading to voids even before plating. Thus, it remains a challenge to achieve an optimum barrier layer and seed material thickness for a continuous coverage on interconnection opening side walls and a wide enough opening of features for electroplating.

BRIEF DESCRIPTION OF THE DRAWINGS

Features, aspects, and advantages of embodiments will become more thoroughly apparent from the following detailed description, appended claims, and accompanying drawings in which:

DETAILED DESCRIPTION

Figure 1:
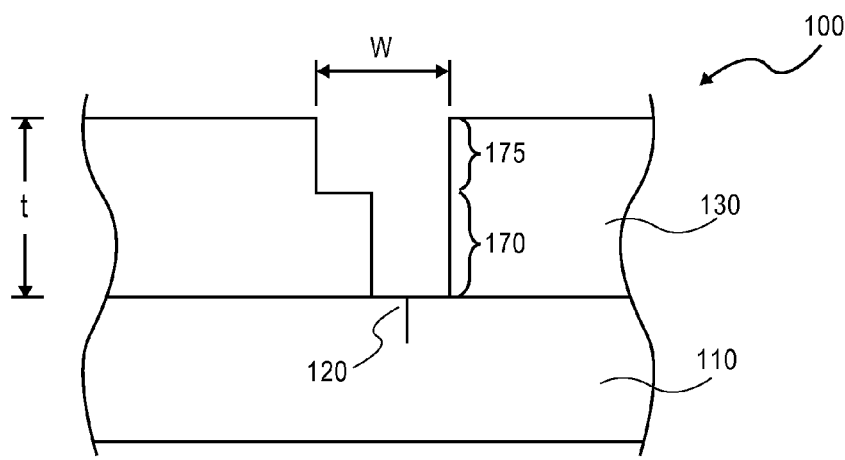
FIG. 1 shows a schematic, cross-sectional side view of an integrated circuit substrate having a dielectric layer formed thereon with a via to a contact opening and a trench formed over the via.

FIG. 1 shows a portion of an integrated circuit structure, such as a portion of a wafer (e.g., silicon wafer) designated for circuit devices to form a microprocessor chip. Structure 100 includes substrate 110 such as a silicon substrate. Substrate 110 may be the wafer substrate having circuit devices, including transistors, thereon as well as one or more levels of interconnection to devices. A typical integrated circuit such as a microprocessor chip may have, for example, five or more interconnection layers or levels separated from one another by dielectric material. FIG. 1 shows contact point 120 that may be a circuit device formed on or in a wafer/substrate or an interconnection line formed above the substrate to devices on the wafer. It is to be appreciated that the techniques described herein may be used for various interconnections within an integrated circuit including to circuit devices and other interconnections. In this sense, contact point 120 represents such devices or interconnections wherein an interconnection contact is made.

FIG. 1 illustrates a cross-sectional side view of a portion of a substrate. Overlying substrate 110 is dielectric material 130. Dielectric material 130 is, for example, silicon dioxide ($SiO_2$) formed by a tetraethyl orthosilicate (TEOS) or plasma enhanced chemical vapor deposition (PECVD) source. Dielectric material 130 may also be a material having dielectric constant less than the dielectric constant of $SiO_2$ (e.g., a "low k" material), including polymers.

FIG. 1 shows via 170 through dielectric material 130 to expose contact point 120. FIG. 1 also shows trench 175 formed in a portion of dielectric material 130 over via 170. A trench and via may be formed according to known techniques by, for example, initially using a mask, such as a photoresist mask to define an area (e.g., a cross-sectional area) on a surface of dielectric material 130 (e.g., a top surface as viewed) for a via opening and etching the via through dielectric material 130 with a suitable chemistry, such as, for example, a $CH_3/CF_4$ or $C_4F_8$ etch chemistry for $SiO_2$. The mask may then be removed (such as by an oxygen plasma to remove photoresist) and a second mask patterned to define an area for a trench opening. Trench opening is patterned to extend a distance into or out of the page, possibly over multiple vias including via 170. A subsequent mask and etch is introduced to form a trench and the second mask is removed leaving the substrate shown in FIG. 1.

Referring to FIG. 1, a line width, w, is defined as a width of trench 175 formed in dielectric 130. It is appreciated that a width of trench 175 may be similar to a diameter of via 170. FIG. 1 shows trench 175 appearing to have a slightly larger width than a diameter of via 170. FIG. 1 also shows dielectric material having a thickness, t, measured from contact point 120 to a height of dielectric material 130 on substrate 110. In one embodiment, dielectric material 130 has a thickness, t, on the order of 200 nanometers. In one embodiment, a desired line width, w, for trench 175 is less than 60 nanometers, including 50 nanometers or less. Accordingly, an aspect ratio of the trench and via opening, measured as the thickness, t, of dielectric material 130 to line width, w, is on the order of four to one to five to one.

Figure 2:
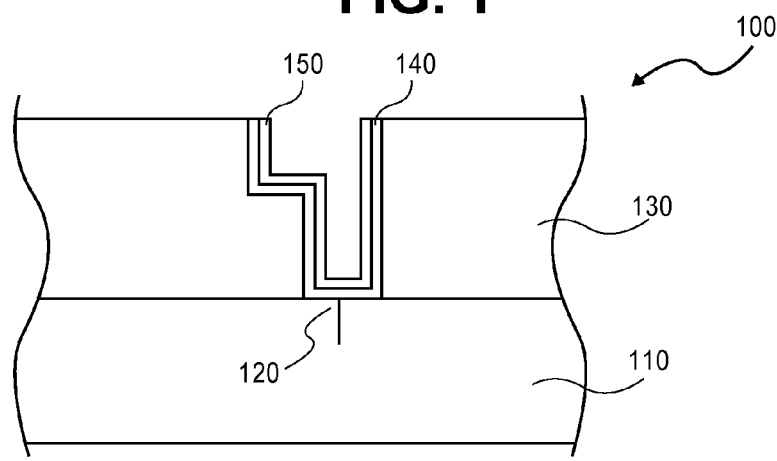
FIG. 2 shows the structure of FIG. 1 following the formation of a barrier layer and a seed material in the interconnect opening.

FIG. 2 shows the substrate of FIG. 1 following the formation of a barrier layer and seed material along the side walls of via 170 and trench 175. In one embodiment, barrier layer 140 is deposited to a thickness on the order of 10 to 30 nanometers depending on the desired characteristics of the barrier layer. For example, barrier layer 140, is chosen, in one embodiment, to be effective to inhibit interconnect material diffusion, such as copper diffusion into dielectric material 130. Barrier layer 140 may also be chosen for its adhering properties to dielectric material 130. Suitable materials for barrier layer 140 include, but are not limited to, tantalum (Ta), tantalum nitride (TaN), tantalum silicon nitride (TaSiN), tungsten (W), tungsten nitride (WN), tungsten silicon nitride (WSiN), titanium (Ti), titanium nitride (TiN), titanium silicon nitride (TiSiN) and cobalt (Co). Barrier layer 140 may be introduced by chemical vapor deposition. In one embodiment, barrier layer 140 is introduced as a blanket over dielectric material 130 and along the side walls of via 170 and trench 175 and on contact point 120 (i.e., at the bottom of via 170 as viewed).

Referring to FIG. 2, overlying barrier layer 140 along the side walls and bottom of via 170 and trench 175 is seed material 150. Seed material 150 is used, in one sense, in connection with a subsequent electroplating process to form an interconnection in via 170 and trench 175. While barrier layer 140 may be a conductive material such as a titanium or tantalum compound that may be capable of carrying a current utilized in a electroplating process, barrier layer 140 may also not be a good conductor and may cause non-uniform current flow which, in turn, may adversely affect an electroplating process and the reliability of the interconnection. Seed material 150, on the other hand, is selected to generally provide a uniform current flow during an electroplating process. Moreover, seed material 150 may be selected to provide enhanced adhesion of the subsequently formed interconnection to the substrate.

In one embodiment, seed material 150 is, for example, a copper material introduced using physical vapor deposition (PVD) techniques. A thickness of seed material 150 along the side walls and bottom of via 170 and trench 175 of three to 20 nanometers is suitable for an embodiment.

Figure 3:
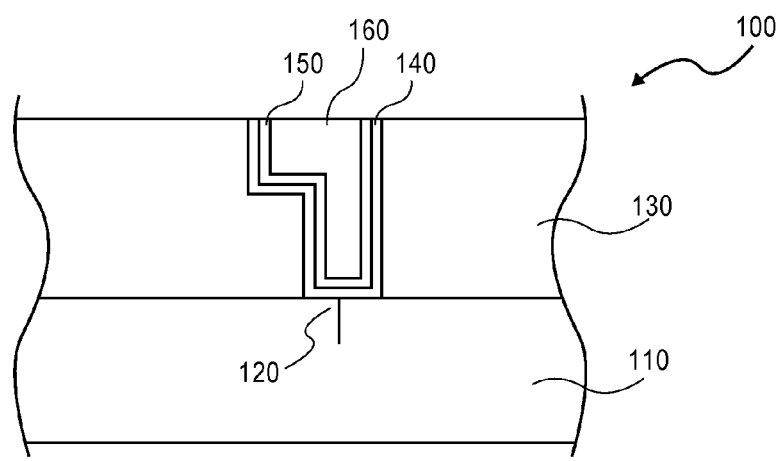
FIG. 3 shows the structure of FIG. 2 following the electroplating of an interconnect material including copper in the interconnect opening.

FIG. 3 shows structure 100 after filling via 170 and trench 175 with interconnection material 160 of, for example, a copper material. One technique for depositing interconnection material 160 of a copper material is an electroplating process. By way of example, a typical electroplating process involves introducing a substrate (e.g., a wafer) into an aqueous solution or bath containing metal ions, such as a copper sulfate-based solution, and reducing the metal ions (reducing the oxidation number) to a metallic state by applying current between the substrate with the seed material and an anode of an electroplating cell in the presence of the solution. Referring to FIG. 3, copper metal is deposited on to seed material 150 to fill via 170 and trench 175 and form copper interconnection material 160.

An electroplating aqueous solution or bath typically contains metal ions, provided by dissolved copper sulfate, and an acid such as sulfuric acid ($H_2SO_4$) to increase conductivity. The plating bath also may include a suppressor additive and an anti-suppressor additive. In one embodiment, a suppressor additive is selective to inhibit plating on side walls of via 170 and trench 175. Without wishing to be bound by the theory, it is believed that the suppressor additive is selected for side walls of a trench and via because a suppressor additive tends to diffuse from the bulk solution and on to side walls due to transport limitations. An anti-suppressor additive is selected, in one embodiment, to act as a catalyst for a plating reaction, particularly at the bottom of a via such as, the bottom of via 170.

In one embodiment, a plating bath such as described includes a suppressor additive of a compound selected from the group of alkoxylated sulfopropylated alkylamines. A suitable alkoxylated sulfopropylated alkylamine includes, but is not limited to, a reaction product of alkoxy alkylated alkylamine and alkyl sultone. The alkoxy alkylated alkylamine has the general formula:

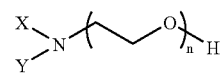

where n ranges from 2 to 200. X and Y are alkyl chains, with general molecular structure $C_mH_{2m+1}$, where m ranges from 1 to 100, particularly methyl ($CH_3$), ethyl ($C_2H_5$), propyl ($C_3H_7$), or butyl ($C_4H_9$) groups. X and Y can be polyethylene glycol polymeric chains and derivatives thereof. Particular examples of the reactant alkyl sultone include, but are not restricted to 1,3-propane sultone and 1,4-butane sultone.

A suitable amount of a suppressor additive of an alkoxylated sulfopropylated alkylamine in an electroplating bath for a copper interconnection is on the order of 10 to 1000 parts per million.

A typical anti-suppressor additive is a disulfide compound. In one embodiment, a suitable anti-suppressor additive is bis-3-sulfopropyl disodium sulfonate.

In addition to the components of a copper ion source, an acid, a suppressor additive and an anti-suppressor additive, a plating bath may also include a leveler, such as a nitrogen-containing compound.

By using a plating bath such as described, including an alkoxylated sulfopropylated alkylamine as a suppressor additive, an electroplating process may be utilized to fill interconnection openings having line widths below 60 nanometers, including line width of 50 nanometers or less, with improved bottom-up filling of the interconnection opening as well as minimal voids. The suppressor additive also a relatively narrow molecular weight distribution (measured using mass spectroscopy) which is expected to provide bath stability and larger operating process windows for deposition offering an advantage over other plating chemistries that use suppressor additives with low molecular weight unstable species that degrade an electroplating bath.

It is believed that a suppressor additive of the group alkoxylated sulfopropylated alkylamine suppresses plating on the trench/via side walls allowing the via bottom to plate at higher rates. It is also believed the suppressor additive of the group alkoxylated sulfopropylated alkylamine tends to interact with the anti-suppressor additive in the plating bath causing the anti-suppressor additive to adsorb preferentially on the bottom of a via, thereby generating an improved (e.g., increased) bottom-up fill rate.

In the preceding detailed description, reference is made to specific embodiments thereof. It will, however, be evident that various modifications and changes may be made thereto without departing from the broader spirit and scope of the following claims. The specification and drawings are, accordingly, to be regarded in an illustrative rather than a restrictive sense.

What is claimed is:

1. A method comprising:
   forming an interconnection opening through a dielectric material to a contact point; and
   electroplating an interconnection comprising copper in the interconnection opening using an electroplating bath comprising an alkoxylated sulfopropylated alkylamine.

2. The method of claim 1, wherein the interconnection opening comprises a base defined by the contact point and a sidewall and prior to plating, the method further comprising:
   seeding the interconnection opening with a conductive material along the base and the sidewall.

3. The method of claim 2, wherein prior to seeding, the method comprises:
   forming a barrier layer along the base and sidewall.

4. The method of claim 1, wherein a line width of the interconnection opening is 60 nanometers or less.

5. The method of claim 1, wherein an aspect ratio of the interconnection opening defined as a thickness of the dielectric material relative to a line width is greater than four to one.

6. The method of claim 1, wherein the alkoxylated sulfopropylated alkylamine comprises a reaction product of an alkoxy alkylated alkylamine and an alkyl sultone.

7. The method of claim 6, wherein the alkoxy alkylated alkylamine has the general formula:

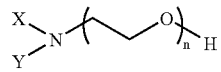

where n ranges from 2 to 200, X and Y are alkyl chains, with general molecular structure $C_mH_{2m+1}$, where m ranges from 1 to 100, polyethylene glycol chains or derivatives thereof.

8. The method of claim 7, wherein the alkyl sultone is selected from 1,3-propane sultone and 1,4-butane sultone.

9. The method of claim 6, wherein a concentration of the alkoxylated sulfopropylated alkylamine in the electroplating bath is 10 to 1000 parts per million.

10. A method comprising:
    forming an interconnection opening through a dielectric material to a contact point; lining the interconnection opening with a barrier layer and a seed layer; and
    electroplating an interconnection comprising copper in the interconnection opening using an electroplating bath comprising an alkoxylated sulfopropylated alkylamine.

11. The method of claim 10, wherein a line width of the interconnection opening is 60 nanometers or less.

12. The method of claim 10, wherein an aspect ratio of the interconnection opening defined as a thickness of the dielectric material relative to a line width is greater than four to one.

13. The method of claim 10, wherein the alkoxylated sulfopropylated alkylamine comprises a reaction product of an alkoxy alkylated alkylamine and an alkyl sultone.

14. The method of claim 13, wherein the alkoxy alkylated alkylamine has the general formula:

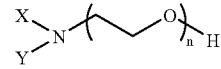

where n ranges from 2 to 200, X and Y are alkyl chains, with general molecular structure $C_mH_{2m+1}$, where m ranges from 1 to 100, polyethylene glycol chains or derivatives thereof.

15. The method of claim 14, wherein the alkyl sultone is selected from 1,3-propane sultone or 1,4-butane sultone.

16. The method of claim 13, wherein a concentration of the alkoxylated sulfopropylated alkylamine in the electroplating bath is 10 to 1000 parts per million.

17. An electroplating bath comprising:
    a copper salt;
    a suppressing additive comprising an alkoxylated sulfopropylated alkylamine; and
    an anti-suppressing additive.

18. The electroplating bath of claim 17, wherein the alkoxylated sulfopropylated alkylamine comprises a reaction product of an alkoxy alkylated alkylamine and an alkyl sultone.

19. The electroplating bath of claim 18, wherein the alkoxy alkylated alkylamine has the general formula:

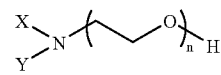

where n ranges from 2 to 200, X and Y are alkyl chains, with general molecular structure $C_mH_{2m+1}$, where m ranges from 1 to 100, and X and Y are polyethylene glycol chains or derivatives thereof.

20. The electroplating bath of claim 19, wherein the alkyl sultone is selected from 1,3-propane sultone or 1,4-butane sultone.

21. The electroplating bath of claim 17, wherein the alkoxylated sulfopropylated alkylamine is present in the electroplating bath in a concentration on the order of 10 to 1000 parts per million.

* * * * *